(12) United States Patent
Colleoni et al.

(10) Patent No.: US 10,480,059 B2
(45) Date of Patent: Nov. 19, 2019

(54) COATING UNIT

(71) Applicant: safematic GmbH, Bad Ragaz (CH)

(72) Inventors: Walter Colleoni, Sulz (AT); Patrick Capeder, Maienfeld (CH); Christof Graf, Sevelen (CH)

(73) Assignee: safematic GmbH, Bad Ragaz (CH)

( * ) Notice: Subject to any disclaimer, the term of this patent is extended or adjusted under 35 U.S.C. 154(b) by 617 days.

(21) Appl. No.: 15/147,933

(22) Filed: May 6, 2016

(65) Prior Publication Data

US 2016/0326639 A1 Nov. 10, 2016

(30) Foreign Application Priority Data

May 6, 2015 (EP) ..................... 15001346

(51) Int. Cl.
  C23C 14/56 (2006.01)
  C23C 14/26 (2006.01)
  C23C 14/24 (2006.01)
  C23C 14/06 (2006.01)
(52) U.S. Cl.
  CPC ............ C23C 14/246 (2013.01); C23C 14/26 (2013.01); *C23C 14/0605* (2013.01); *C23C 14/56* (2013.01)
(58) Field of Classification Search
  CPC ... C23C 14/246; C23C 16/44; C23C 14/0605; C23C 14/32
  USPC .......................................... 226/181, 186, 187
  See application file for complete search history.

(56) References Cited

U.S. PATENT DOCUMENTS

| 3,097,113 | A |   | 7/1963  | Welsh |
| 3,371,649 | A | * | 3/1968  | Gowen ................... C23C 14/32 |
|           |   |   |         | 118/723 VE |
| 4,096,055 | A |   | 6/1978  | Johnson |
| 4,098,919 | A | * | 7/1978  | Morimoto ............. C23C 14/221 |
|           |   |   |         | 148/DIG. 169 |
| 4,169,031 | A |   | 9/1979  | Brors |
| 4,173,522 | A |   | 11/1979 | Pulker et al. |
| 4,810,347 | A |   | 3/1989  | Smith |

(Continued)

FOREIGN PATENT DOCUMENTS

DE   196 51 615 C1   7/1997
EP    0 955 666 A1  11/1999

(Continued)

OTHER PUBLICATIONS

English translation of WO 2014191688 (Year: 2014).*

(Continued)

*Primary Examiner* — Aiden Lee
(74) *Attorney, Agent, or Firm* — Renner, Otto, Boisselle & Sklar, LLP

(57) ABSTRACT

A coating unit is introduced which coating unit comprises a thread conveyor. The thread conveyor comprises a first clamp and a second clamp for holding the thread there between. A rotatable support is provided for holding the first and the second clamp. Deflection means are provided in the thread conveyor for consecutively transforming the first and the second clamp from a closed position into an open position and back to a closed position in response to rotating the support. A drive is provided for rotating the support for evoking an unwinding of the thread from a spool if being clamped by the first or the second clamp and for clamping the unwound thread in the second or first clamp respectively in response to rotating the support.

16 Claims, 10 Drawing Sheets

(56) References Cited

U.S. PATENT DOCUMENTS

| | | |
|---|---|---|
| 5,084,151 A | 1/1992 | Vallana et al. |
| 5,242,566 A | 9/1993 | Parker |
| 5,494,558 A | 2/1996 | Bunshah et al. |
| 5,507,930 A | 4/1996 | Yamashita et al. |
| 6,063,245 A | 5/2000 | Frach et al. |
| 6,077,407 A | 6/2000 | Liehr et al. |
| 7,879,209 B2 | 2/2011 | Tilsch et al. |
| 8,273,221 B2 | 9/2012 | Schneider et al. |
| 2002/0011205 A1* | 1/2002 | Yamazaki ............ C23C 14/564 118/620 |
| 2007/0246356 A1 | 10/2007 | Tokimitsu |
| 2013/0319328 A1 | 12/2013 | Wurzinger et al. |
| 2013/0323407 A1 | 12/2013 | Wurzinger et al. |

FOREIGN PATENT DOCUMENTS

| | | |
|---|---|---|
| EP | 1 964 150 B1 | 4/2012 |
| IN | 1162/CHE/2009 | 6/2009 |
| WO | 2014/191688 A1 | 12/2014 |

OTHER PUBLICATIONS

Extended European Search Report for corresponding of EP Application No. 15001346.4 dated Nov. 4, 2015.

LEICA Microsystems, Living Up to Life, "Vacuum Coating Techniques and Coating Systems for Electron Microscopy", Jan. 2008.

BAL-TEC AG, "Operating Instructions for CTA020/SCD 005 Special", Sep. 27, 2005.

Quorum Technologies Limited Co., Quick Overview, "Q150T Turbo-Pumped Sputter Coater/Carbon Coater", Feb. 23, 2012.

Quick Overview, "BT 150 and BT300 Bench Top Coaters", HHV 2015.

* cited by examiner

COATING UNIT

TECHNICAL FIELD

The present invention relates to a coating unit, a base unit, an apparatus for coating material onto a sample, and to a method for coating material onto a sample.

BACKGROUND ART

Conventional apparati for coating material provided in form of a thread require manual interaction for changing the thread.

DISCLOSURE OF THE INVENTION

The problem to be solved by the present invention is to provide an apparatus and related components enabling an automated thread exchange for continuous coating.

This problem is solved by a coating unit for coating a sample with material provided in form of a thread. The thread may preferably be a carbon thread for generating a carbon coating. The thread preferably is heated by means of an electrical current such that the material of the thread dissolves by thermal evaporation and deposits onto the sample. The coating unit comprises a thread conveyor. The thread conveyor in turn comprises a first clamp and a second clamp for holding the thread there between. The first and the second clamp are arranged on a rotatable support, preferably on a front side of the support. Deflection means are provided for individually transforming the first and the second clamp from a closed position into an open position and back to a closed position in response to rotating the support. The deflection means preferably is arranged facing a back side of the support, i.e. opposite the front side. Individually in this context means that preferably only one of the first and the second clamp is opened at a time while during this time, the other clamp remains closed. A drive is provided for rotating the support. The drive may preferably contain an electric motor. The rotation of the support evokes an unwinding of the thread from a spool in case the thread is clamped by at least one of the clamps. In the process of thread conveying, the thread typically is only held by one of the clamps while the other clamp holds a residual piece of thread being left over from burning the thread during coating. Hence, when the thread connected to the spool is clamped by the first clamp, the rotation of the support makes the thread become further unwound from the spool and evokes an automated clamping of the unwound thread portion in the second clamp. It is noted that the unwound thread to be clamped in the second clamp not precisely needs to be a portion newly unwound but may also constitute a portion of the thread that already was unwound prior to the thread conveying operation and as such constitute a piece of thread between the first clamp and the spool. In the same way, when the thread connected to the spool is clamped by the second clamp, the rotation of the support makes the thread become further unwound from the spool and evokes an automated clamping of the unwound thread in the first clamp. By continuously rotating the support in one direction which is referred to as operational rotation direction, new portions of thread can be taken from the spool and be clamped between the clamps for applying a current thereto for dissolving material from the thread by means of heat generated by the electrical current. This thread conveying process does not require any manual interaction. Hence, a coating can be provided without any interference in the vacuum preferably provided in a vacuum chamber during coating.

As to the construction of the clamps, it is preferred that each clamp comprises an element stationary with respect to the support and an element movable with respect to the stationary element for clamping the thread between. For example, each movable element comprises a push rod and each stationary element comprises a shell for the push rod. Each shell preferably protrudes from the front side of the support while each push rod is surrounded by the associated shell, and additionally reaches through a corresponding hole in the support. The deflection means is capable to act on the portion of the push rod reaching through the support such that the push rod is deflectable from the associate shell against a biasing force in response to passing at least a portion of the deflection means. Each push rod preferably comprises a plate at the opposite end resting on the associate shell in a closed position of the clamp which plate is lifted from the shell in response to the subject push rod being impacted by the deflection means. In case the deflection means comprises a rising ramp, the push rod is lifted with respect to the associated shell when passing the rising ramp. Preferably, the deflection means comprises in addition a falling ramp and preferably a platform between the rising and the falling ramp. In case the push rod passes the platform during rotation of the support, the clamp remains open, while when subsequently passing the falling ramp, the push rod is lowered again into its closed position. Hence, when rotating the support in an operational rotation direction, one of the clamps first is opened, remains open for at least a short time, and automatically closes again in response to further rotation of the support. During the time the subject clamp is opened, the (unwound) thread to be clamped by this clamp is automatically arranged laterally next to the clamp first and between the plate and the shell next such that the subsequent closing of the shell fixes the thread in the clamp.

In a preferred embodiment, the deflection means are shaped and arranged such that they only operate on one of the clamps—i.e. individually—while the other clamp remains closed owed to the biasing force which, for example, may be a spring force.

Preferably, a first electrical contact and a second electrical contact are arranged stationary for contacting one of the clamps each provided the support is rotated into a so called coating position. Stationary in this context means that the contacts are e.g. arranged fixed on a plate and do not move. Hence, by rotating the support, the clamps, and especially the shells of the clamps may be brought into a position to contact to the contacts. However, in a different embodiment, the contacts may contact conducting structures of the support which in turn contact the individual clamps. However, it is envisaged that only in this coating position of the support, the contacts contact the clamps or the support while in any other rotational position of the support the contacts do not connect to the clamps or the support such that the thread cannot be supplied by an electrical current in these other rotational positions. In a preferred embodiment, the clamps are arranged on the support symmetrically with respect to a rotation axis of the support, and the contacts are arranged symmetrically with respect to a rotation axis of the support, too, but outside the support. Preferably, the contacts are spring contacts. Preferably, a current can be supplied to the electrical contacts, e.g. via brackets holding the contacts.

In a preferred embodiment, a receptacle is arranged at the front side of the support but not necessarily on the support. The receptacle, also referred to as shutter is movable and its position is preferably electrically controllable. Especially, the receptacle can be deflected with respect to a support axis. In a first position of the receptacle, a residue of the thread remaining from burning the thread can be collected, while in a second position of the receptacle a free deposition of dissolved thread material onto the sample is enabled.

Hence, a compact coating unit is provided, preferably having a size at max of 30 cm in length*20 cm in width*10 cm in height, defined by its housing, which for example, may be made from metal or plastics. Generally, the coating unit is a modular component that can be removed from a base unit comprising a vacuum pump and from a vacuum chamber which three components preferably contribute to an apparatus for coating material on a sample and to a corresponding kit of parts. Hence, the coating unit as presently suggested includes an interface connecting to the base unit, also referred to as "coating unit-base unit interface", and an interface connecting to the vacuum chamber, also referred to as "coating unit-vacuum chamber interface". In general, both interfaces may encompass mechanical features for connecting the subject two units, while at least the coating unit-base unit interface may also encompass an electrical interface.

In a further embodiment, the coating unit comprises a glowing module. A glowing step may be applied to the coating on the sample for electrically charging the coating positive or negative, or for rendering the coating hydrophilic or hydrophobic. Hence, it is preferred to apply the glowing process, if desired at all, after having coated the sample e.g. by a carbon coating from the thread as explained in the various other embodiments.

The glowing module may include a cathode electrically connected to a transformer arranged in the coating unit for applying a high glowing voltage between the cathode and a grounded sample support carrying the sample as will be introduced later on. During the glowing process, the high glowing voltage generated by the transformer is applied to the cathode while process gas, such as argon or air or alkylamine or methanol, is supplied via a gas outlet of the coating unit into the vacuum chamber. As a result, the process gas is ionised for generating a plasma impacting the carbon coating on the sample.

For enabling glowing, a gas inlet is provided in the coating unit, and the gas outlet is arranged for supplying the process gas received via the gas inlet into the vacuum chamber. For generating the glowing voltage, it is preferred that the transformer is arranged in the housing of the coating unit for increasing a supply voltage into the glowing voltage for ionising the process gas. Conceptually, the supply of the process gas into the vacuum chamber is arranged at an opposite end of the vacuum chamber than the vacuum pump which is in contrast to the designs of the prior art. This results in various significant advantages: Given that the supply of the process gas now is arranged close to the cathode, the ionisation can be conducted more efficient with respect to energy consumption, i.e. less power is required for ionisation than in the art. In addition, the gas supply now is closer to the support table for holding the sample to be glowed, such that the sample can be glowed more efficient and more uniform. These advantages in turn enable the transformer for generating the glowing voltage to become smaller in size such that it can be integrated in the housing of the coating unit. This in turn makes the transformer be arranged close to the cathode such that an elaborate supply of high voltage from a remote transformer can be avoided including electrical and mechanical protection means.

Preferably, the gas inlet and the gas outlet of the coating unit are represented by one or more holes/openings in members of the coating unit, and hence are fed through the housing of the coating unit. While the gas inlet may include a pipe fed through the housing or a connector for a gas supply pipe, the gas outlet is arranged such that it faces an interior of the vacuum chamber as long as the vacuum chamber is connected to the coating unit via a coating unit-vacuum chamber interface. In a preferred embodiment, the gas outlet comprises a dispenser ring preferably made from metal, preferably having a hollow interior such that the ring takes the shape of a tube, and preferably comprising multiple bores facing the vacuum chamber when connected to the coating unit. By such means, the process gas can be supplied uniform into the vacuum chamber.

In one embodiment the vacuum chamber may be embodied in form or a cylinder wall preferably made from glass having an open top end and an open bottom end. A top rim of the glass cylinder, i.e. its open top end, preferably abuts against the housing or another member of the coating unit when connected, and preferably abuts against a sealing ring either inserted into a member of the coating unit, or applied to the rim of the vacuum chamber, or clamped between the vacuum chamber and the coating unit. The gas outlet if any preferably is arranged within the sealing ring or, more generally within a circumference where the vacuum chamber is supposed to meet the coating unit. In case the vacuum chamber has a cylindrical shape and may meet the coating unit with a circular end/rim thereof, it is preferred that the dispenser ring is of circular shape as well. In view of a uniform distribution of the process gas into the vacuum chamber, it is preferred that the dispenser ring comprises multiple bores enabling process gas to exit, a majority or all of which bores are preferably arranged equidistant.

Preferably, an electrically operable valve is provided in the coating unit for adjusting a flow of the process gas into the gas outlet. The valve serves for adjusting the flow of the process gas into the vacuum chamber when connected. In a preferred embodiment, the valve is arranged closer to the gas outlet than to the gas inlet, and specifically, the valve is arranged at a maximum distance of five centimetres from the dispenser ring. This enables a fine control of process gas supply into the vacuum chamber e.g. in the range of a μl/sec throughput which in turn results in a more efficient, and especially power efficient processing which again results in reduced dimensions of the transformer, for example. Between the gas inlet and the gas outlet, the process gas preferably is guided in a pipe. Controlling the process gas by means of the valve may not only include an adjustment of the flow but also include a termination of the flow or an unrestricted flow of the process gas towards the gas outlet. The valve may in a preferred embodiment comprise a solenoid.

The transformer preferably receives a supply voltage and transforms this supply voltage into the glowing voltage required for ionising the process gas in the vacuum chamber. The supply voltage preferably is not the conventional supply voltage out of a wall socket but is a supply voltage supplied by the base unit to be introduced in more detail later on. Preferably, the supply voltage is in the range between 10 V and 100 V DC, and preferably is 24 V DC. This supply voltage is increased to the glowing voltage which may be in the range between 100 V DC and 1000 V DC, and more preferably between 300 V DC and 800 V DC. Preferably, the glowing voltage is electrically adjustable, and is variable. In view of the above, it is preferred that the coating unit-base unit interface comprises a connector plug, wherein the connector plug comprises at least one pin for the supply voltage. Generally, a plug module of the connector plug at the coating unit may comprise pins or receptacles, while a plug module at the base unit may comprise the opposite thereof, i.e. receptacles or pins respectively. In a preferred embodiment, the connector plug is a multi-pin connector, such as a 22-pin connector. In a very preferred embodiment, the connector plug comprises a through-hole representing the gas inlet. A sealing may be provided for sealing the gas transmission between the plug module of the coating unit and the plug module of the base unit. As a consequence, it is preferred that both plug modules comprise the through-hole matching each other upon connecting the coating unit to the base unit. Hence, it is preferred that the process gas, or possibly a ventilation gas or a purge gas is supplied via the base unit rather than from the outside directly into the coating unit.

The coating unit-base unit interface may in addition to the connector plug provide mechanical fixation means for attaching the coating unit to the base unit, such as clip, screw or other type of connections. The base unit may further comprise a reception area for the coating unit which reception area comprises the base units plug module.

In a preferred embodiment, a plate is provided for supporting the thread conveyor. The thread conveyor preferably is arranged between the plate and the glowing module if applicable. The cathode may take the shape of a ring, and preferably is made from aluminum. Preferably, a protection ring is arranged between the cathode and the thread conveyor for preventing dissolved thread material impacting the cathode.

According to another aspect of the present invention, a base unit is provided comprising a housing and a vacuum pump arranged in the housing, for generating a vacuum in the vacuum chamber when connected to the base unit via the corresponding interface. Hence, the vacuum pump, which may include a multitude of vacuum pumps such as a low vacuum pump and in addition a high vacuum pump, is arranged in the base unit but not in the coating unit. The base unit preferably has a dimension of at max of 0.6 m in length*0.4 m in width*0.4 m in height, defined by its housing, which for example, may be made from metal or plastics. Hence, it is preferred that the base unit is of a size that makes it a table-top unit.

Preferably, the base unit comprises an interface for removable connecting the base unit to a vacuum chamber. This interface may be arranged at a top surface of the base unit such that the vacuum chamber may rest upright on the interface. For this purpose, the base unit may comprise a step in the shape of its housing, a horizontal surface of which step includes the interface towards the vacuum chamber.

Comparable to the coating unit-vacuum chamber interface, the present base unit-vacuum chamber interface may comprise a metal ring in a component, such as a stand, for example, to place the vacuum chamber with the rim defining its open bottom end on. In case the vacuum chamber is embodied in form or a cylinder wall, its bottom end abuts against such ring in the stand of the base unit, and preferably against a sealing ring either inserted into the stand, and especially into the ring of the stand, or applied to the rim of the vacuum chamber, or clamped between the vacuum chamber and the stand.

Preferably, the stand for the vacuum chamber in the base unit is connected to the vacuum pump for generating a vacuum in the vacuum chamber during processing. It is noted that the vacuum chamber does not entail a vacuum per se but defines a space in form of a recipient into which the sample is arranged, and to which space a vacuum can be established in response to operating the vacuum pump. It is further noted that a vacuum in the spirit of the invention not only encompasses a vacuum in a pure mathematical sense, but entails any low pressure condition sufficient for enabling the coating from a thread for a widely collision-free deposition of material dissolved from the thread, and for glowing if applicable.

In view of some embodiments of the coating unit referred to above, it is preferred that the base unit comprises a transformer for transforming a wall socket voltage of e.g. 220 V into the supply voltage of e.g. 24 V supplied to the coating unit via the subject coating unit-base unit interface, and preferably via the connector plug. In turn, the base unit may have a cable and a connector ready to plug into a wall socket and receive power therefrom. Preferably, the base unit comprises a gas inlet for the supply of the process gas. The gas inlet may take the form of a pipe through a wall of the housing or a plug connection preferably sealed. The base unit may provide a reservoir in its housing for storing an amount of process gas, or may directly supply the process gas from its gas inlet to its gas outlet leading to the coating unit via a pipe internal to the base unit. A valve in the base unit may control the supply of process gas to the coating unit. Preferably, the base unit comprises another one or more gas inlets, e.g. for receiving a purging gas and/or a venting gas.

Preferably, a sample support is arranged in an opening of the housing facing the vacuum chamber. The sample support may comprise a plate having a flat top surface for depositing a sample on which sample is intended to be coated. The plate may rest on and/or be fixed to a pole that reaches into the interior of the housing of the base unit and is pivot-mounted e.g. in the stand—wherein the pole takes the function of a spindle—or is non-rotatable. Hence, the sample support preferably emerges from the top surface of the base unit, preferably vertically, and may be removable from the base unit, and preferably is adjustable in height. In a preferred embodiment, the base unit comprises a drive for one or more of rotating and tilting and planetary moving the sample support or parts thereof. Given that the origin of the coating material is rather spot-like in form of the location at which the thread is dissolved, it may be preferred to move the sample by means of a movable sample support in order to achieve a homogeneous coating all over the sample. For this purpose, the sample support may be mounted one or more of tiltable, rotatable, and planetary movable. A corresponding drive may be controlled during the coating as to move the sample support in order to effect this homogeneous coating. In particular a planetary gear may be employed for moving the sample support and as a result the sample during coating.

In a very preferred embodiment, the base unit comprises a sensing arrangement for determining a thickness or height of material coated on one of the sample support and the sample. Preferably, the actual sensor of the sensing arrangement is a crystal such as a quartz which is excited to a resonance frequency for sensing. The crystal preferably is arranged on or in the sample support, and specifically on a top surface of the plate where the sample is supposed to be arranged to. The area of the oscillating crystal may, during coating, be covered with target material provided the sample is not arranged to cover the oscillating crystal. In this embodiment, the oscillating crystal, excited by electrical power to a resonance frequency may show a deviation of the resonance frequency in response to target material depositing on the oscillating crystal. The amount of the deviation may be a measure of a height of the coating residing on the oscillating crystal. In view of the oscillating crystal being covered by a certain amount of target material, a sample arranged on the sample support is assumed to be covered by the same amount of target material such that from a deviation of the resonance frequency the present thickness of the coating deposited on the sample can be derived. Preferably, such determination of the present thickness is made dependent on a specific weight of the coating material, which is typically known, and the geometry of the area of the oscillating crystal which is known either. The according calculations are preferably conducted by a control unit in the base unit to which the oscillating crystal is electrically connected to, e.g. by means of a flex cable, wherein the signal representing a deviated resonance preferably is transmitted digitally.

In another embodiment, two oscillating crystals are arranged on or in the plate of the sample support at difference locations, e.g. one in the middle of the plate and the other one outside the centre of the plate, e.g. close to its edge. This enables measuring the thickness of the coating for different sample geometries, wherein if one of the oscillating crystals is covered by the sample, the other oscillating crystal may remain uncovered and conduct the measurement. In a different embodiment in which one of the oscillating crystals is uncovered and the other one is covered by the sample, the covered oscillating crystal may serve as a reference spot which enables compensating temperature and other dependencies of the sensing arrangement, e.g. when subtracting the signals stemming from the two oscillating crystals.

Preferably, a control unit is hence configured to adjust the thread conveyance in the coating unit dependent on the feedback of already coated material received from the sensing arrangement. In this context, the thread may no longer be conveyed for evaporation, and/or electrical current may no longer be supplied to the clamped thread.

In a further embodiment, a pressure sensor is provided in the base unit or alternatively in the vacuum chamber for sensing a pressure in the vacuum chamber, and therefore preferably is exposed to the pressure of the vacuum chamber when connected to the base unit. A signal of the pressure sensor may be used for one or more of a) controlling the vacuum pump, b) controlling the transformer and via the transformer the glowing voltage if applicable, or c) controlling the valve and hence the supply of process gas into the vacuum chamber if applicable.

In a further embodiment, a glowing current between the cathode of the glowing module and the sample on the sample support is sensed. Preferably, the control unit may be configured to adjust the operation of the transformer in the coating unit dependent on the condition in the vacuum chamber, e.g. dependent on the pressure in the vacuum chamber, and e.g. dependent on the glowing current.

Preferably, the control unit is arranged in the base unit and is embodied as a microprocessor for executing software, or is embodied entirely hardwired, or is embodied in form of firmware, which control unit in one example enables a fully automated coating and/or glowing process.

According to a further aspect of the present invention, an apparatus is provided for coating material onto a sample, the apparatus comprising a coating unit according to any one of the preceding embodiments, a base unit according to any one of preceding embodiments, and a vacuum chamber comprising an open upper end and an open lower end, wherein the vacuum chamber is connected with its open upper end to the coating unit via the coating unit-vacuum chamber interface, wherein the vacuum chamber is connected with its lower open end to the base unit via the base unit-vacuum chamber interface, and wherein the coating unit is connected to the base unit via the coating unit-base unit interface.

In view of the modular set-up of the apparatus, it is envisaged that the base unit can be coupled to a unit different than the coating unit, which different unit may implement a different process, and in particular a different process of depositing material on a sample arranged on the sample support of the base unit, such as a sputter unit. For this purpose, it is preferred that the base unit comprises an input means for selecting the deposition process to be applied which process should be in accordance with the unit connected to the base unit and the vacuum chamber. Hence, in one embodiment, the method may be enhanced by receiving a process selection via the input means. In response thereto, the according automated process is selected from a library of processes stored in the base unit e.g. in form of software. In a different embodiment, each unit to be attachable to the base unit may comprise a coding, e.g. a mechanical or an electrical coding in the coating unit-base unit interface, to enable the base unit to automatically select the corresponding processing.

The user interface of the base unit preferably comprises a display for displaying results of the process, parameters measured during processing, etc. The display may be embodied as a touchscreen and enable the above input functions.

According to another aspect of the present invention, a kit of parts is proposed comprising a base unit, a coating unit, and a vacuum chamber.

Generally, various units and processes can be applied for preparing samples, e.g. for coating samples to subsequently be investigated with an electron microscope with a carbon coating that is applied by the coating process as disclosed. However, the units/apparatus may also be used in the manufacturing of microelectronic devices which shall also be covered by coatings. Here, a thin-film of e.g. carbon may be deposited on a substrate or on other layers on a substrate, which target device then shall be referred to as a sample, too. Coatings even in the nm range can be produced by the present apparatus. On the other hand, coatings up to the μm range can be produced without dissolving the vacuum conditions.

According to a further aspect of the invention, a method is provided for coating a sample with material provided in form of a thread, comprising the steps of
  clamping the thread in a first and a second clamp, each clamp being arranged on a rotatable support,
  rotating the support into a coating position with the first and the second clamp being in contact with a stationary electrical contact each,
  applying a current through the thread between the clamps via the electrical contacts causing dissolving material from the thread,
  rotating the support thereby unwinding the thread still clamped to the first clamp from a spool,
  continuing rotating the support for clamping the unwound thread in the second clamp by means of a deflection means acting on the second clamp causing a consecutive opening and closing of the second clamp, and
  continuing rotating the support into the coating position.

Except for the first step, which may also be omitted when starting from a prepared coating unit in which the thread already is inserted into the clamps, all other steps are executed automatically, preferably controlled by the control unit.

Preferably, prior to or immediately after clamping the thread in the clamps, the sample is arranged on a sample support in a vacuum chamber connected to the coating unit, and a desired thickness of material to be coated onto the sample is selected via a user interface.

Arranging the sample onto the sample support may include arranging the sample without covering at least an oscillating crystal used for measuring a thickness of a coating on the sample. Arranging the sample on the sample support may include adjusting a plate of the sample support to a desired height, and/or mounting the sample on the plate by means of stubs, e.g. reaching into small opening of the plate. Preferably, the arranging of the sample on the sample support is performed without having yet attached the vacuum chamber to the base unit and the coating unit to the base unit. Once the sample is arranged on the sample support, the vacuum chamber may be mounted onto the base unit, and specifically on a sealing of a stand of the base unit. In a further step, the coating unit preferably is connected to the base unit via a plug connector.

Preferably, a thickness of the coating on the sample is measured during coating, and the coating process is automatically terminated in response to the measured thickness being equal to or exceeding the selected thickness. Preferably, prior to applying the current, a vacuum pump of a base unit connected to the vacuum chamber is automatically turned on while the pressure in the vacuum chamber is measured continuously or at predefined discrete times.

The automated coating process preferably is started by pushing a start button. In response to the start, the vacuum pump is activated and the vacuum chamber is evacuated. It is preferred that the evacuation continues as long as a target start pressure is reached in the vacuum chamber. A pressure sensor arranged in the vacuum chamber or the base unit may sense the present pressure and supply this pressure information in form of a pressure signal to the control unit. The target start pressure may be automatically selected by the coating program, or may be selected and entered manually by the operator via the user interface. Preferably, the control unit is configured to control the vacuum pump such that the target start pressure is reached and preferably is maintained. The target start pressure and/or the pressure presently measured may be displayed by the user interface. In one embodiment, once the target start pressure is reached in the pressure chamber, further automated processing steps are released.

In a preferred embodiment, the coating process is followed by a glowing process for glowing the coating on the sample. This glowing process may be entered by the user at the beginning when entering the parameters for the coating process. Preferably, the user is required to input one or more of a desired glowing time, a chosen process gas, and a desired glowing pressure in the vacuum chamber. In case the glowing option is chosen by the user, once the coating process is finalized, the glowing process may automatically be started, e.g. by adapting the pressure to the desired or a default glowing pressure without any manual interference. Once the desired or default glowing pressure is reached, the glowing automatically starts by applying the glowing voltage to the cathode of the glowing module as introduce above while process gas is supplied into the vacuum chamber. The supply of process gas into the vacuum chamber and the application of the glowing voltage is automatically terminated once the desired glowing time is reached. Prior to starting the automated process, a suitable cathode may need to be inserted into a fixture of the coating unit by the operator.

Preferably, one or more or all of the target coating thickness, the measured coating thickness, the process gas, the current process pressure, the target process pressure, a calculated remaining coating time, a past coating time, the entered glowing time, and the remaining glowing time may be displayed to the user on the user interface during the process.

Any of the parameters may be input up-front to initiating the evacuation, may be input after the evacuation, may be input on demand, may be input voluntarily, or may be input or amended even during the processing. In a different embodiment, only the target coating thickness is expected to be entered by the user, while all the other parameters are automatically determined or set. In a different embodiment, various different predefined or determined coating processes may be offered to the user for selecting, e.g. in response to entering the target coating thickness.

The fully automated method provides significant advantages over conventional processing methods in view of reduced processing times, and improved coating results in terms of quality given that, for example, the vacuum conditions are not required to be abandoned and the vacuum pump is not to be restarted for the reason for gaining access to the sample and taking a measurement of the coating thickness, or for the reason for having to clamp a new portion of thread between the clamps. In view of the reduced processing times, industrial manufacturing of coated substrates can be realized. New deposition processes can be applied.

Other advantageous embodiments are listed in the dependent claims as well as in the description below.

The described embodiments similarly pertain to the units and to the method. Synergetic effects may arise from different combinations of the embodiments although they might not be described in detail.

BRIEF DESCRIPTION OF THE DRAWINGS

The embodiments defined above and further aspects, features and advantages of the present invention can also be derived from the examples of embodiments to be described hereinafter and are explained with reference to the drawings. In the drawings it is illustrated in.

MODES FOR CARRYING OUT THE INVENTION

In the following, the same elements are referred to by the same reference signs across all Figures.

Figure 1:
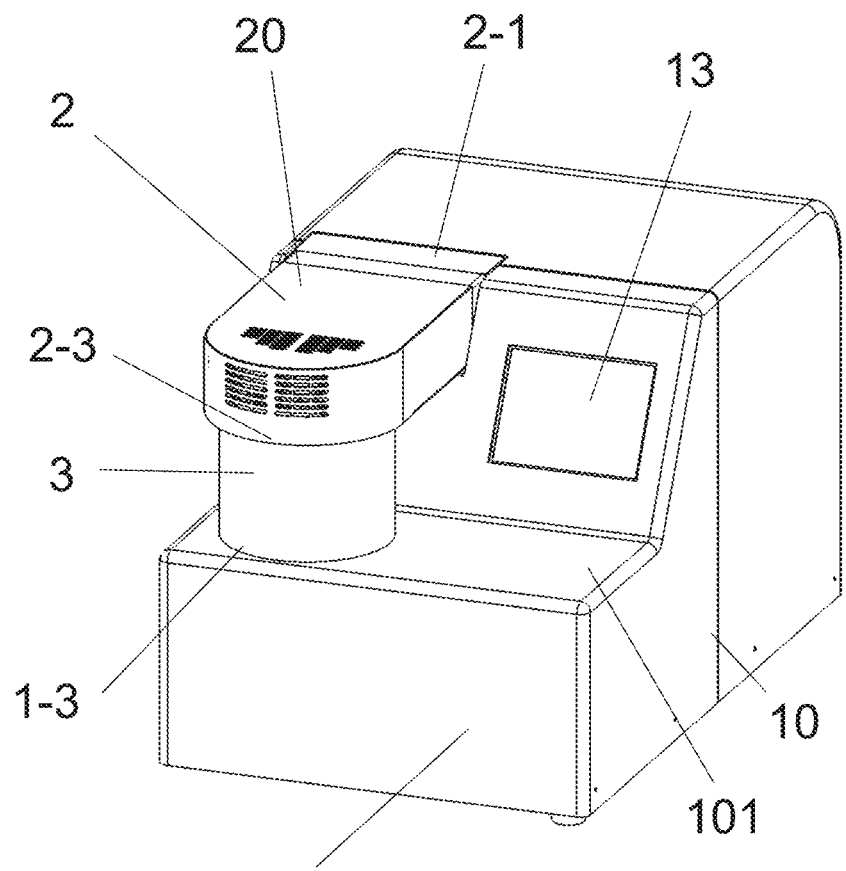
FIG. 1 an apparatus in a perspective view, according to an embodiment of the present invention.

FIG. 1 illustrates a perspective view of an apparatus for coating material on a sample according to an embodiment of the present invention. The apparatus comprises a base unit 1, a coating unit 2 and a vacuum chamber 3. The base unit 1 comprises a housing 10, and in the housing 10 a vacuum pump (not visible) for generating a vacuum in the vacuum chamber 3. The vacuum chamber 3 preferably has the shape of a cylinder wall and is made of glass. A base unit-vacuum chamber interface 1-3 provides for a mechanical settling of the vacuum chamber 3 on/in the base unit 1 or a member thereof. Presently, a top surface 101 of the housing 10 provides an opening contributing to the mechanical interface 1-3, into which opening the vacuum chamber 3 reaches for sitting on a stand of the base unit 1, as will be shown in FIG. 12 in more detail. A coating unit-vacuum chamber interface 2-3 comprises likewise an opening in the housing 20 of the coating unit 2 such that the vacuum chamber 3 reaches into the opening for e.g. pressing against a sealing ring (not visible). The coating unit-vacuum chamber interface 2-3 comprises a thread conveyor (not visible) as will be explained later on. The coating unit 2 and the base unit 1 are connected to each other via a coating unit-base unit interface 2-1 which in the present example comprises a mechanical portion containing a reception, and an electrical portion in form of a connector plug (not visible). Via the connector plug, a supply voltage is supplied from the base unit 1 to a transformer in the coating unit 2. The base unit 2 further comprises a user interface 13 in form of a touchscreen as input and output means. The base unit 2 comprises a control unit (not visible) for controlling a coating process. The base unit 1 preferably can be connected to a wall socket with a standard power cable. The base unit 1, the coating unit 2, and the vacuum chamber 3 are removable from each other.

The coating unit 2 comprises a housing 20. In a preferred embodiment, the transformer (not visible) is arranged in the housing 20 for generating a glowing voltage. In addition, the coating unit 2 preferably comprises a gas outlet (not visible) for supplying a process gas into the vacuum chamber 3 which process gas is ionised in response to applying the glowing voltage. In addition, it is preferred that the coating unit-base unit interface 2-1 comprises a gas inlet into the coating unit 2, preferably in from of a through hole in the plug connector for supplying process gas from the base unit to the coating unit 2. Preferably, the coating unit-vacuum chamber interface 2-3 additionally comprises a gas outlet such that the process gas can be supplied into the vacuum chamber 3. Correspondingly, the base unit 1 preferably comprises a gas inlet for supplying a process gas, e.g. argon, to the base unit, if applicable. Preferably, the base unit 1 additionally comprises another gas inlet for supplying a venting gas, e.g. for supplying N2.

Figure 2:
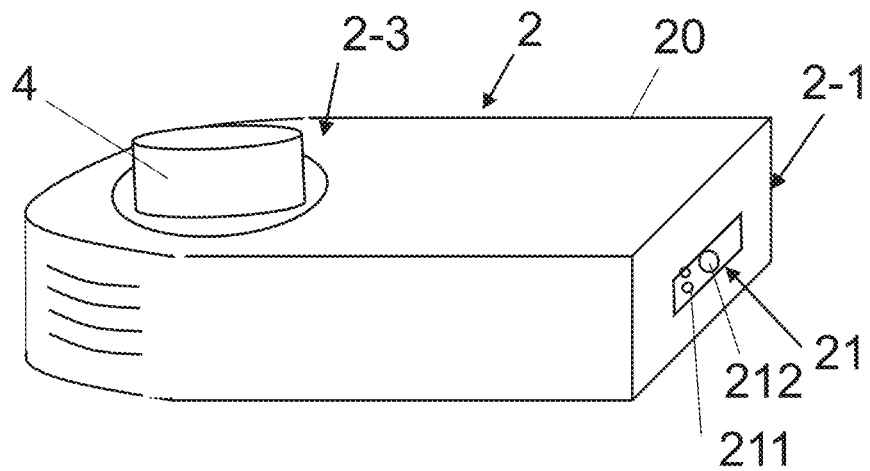
FIG. 2 a coating unit in a perspective view on its bottom side, according to an embodiment of the present invention.

FIG. 2 illustrates an embodiment of a coating unit 2 according to an embodiment of the present invention, e.g. as may be used in an apparatus of FIG. 1. The coating unit 2 comprises a housing 20, and a coating unit-base unit interface 2-1 comprising a connector plug 21. Preferably, the coating unit side of the interface 2-1 comprises a male connector comprising pins 211, e.g. twenty-two pins 211, only two of which are symbolically introduced in FIG. 2. The connector plug 21 may comprise a through-hole 212 for supplying gas from the base unit 1 to the coating unit 2 if needed. Hence, the connector plug 21, possibly in combination with other mechanical means, serves as interface 2-1 towards the base unit 1.

The coating unit 2 additionally comprises a coating unit-vacuum chamber interface 2-3. In particular, the coating unit-vacuum chamber interface 2-3 comprises a thread conveyer 4 only schematically shown in FIG. 2.

Figure 3:
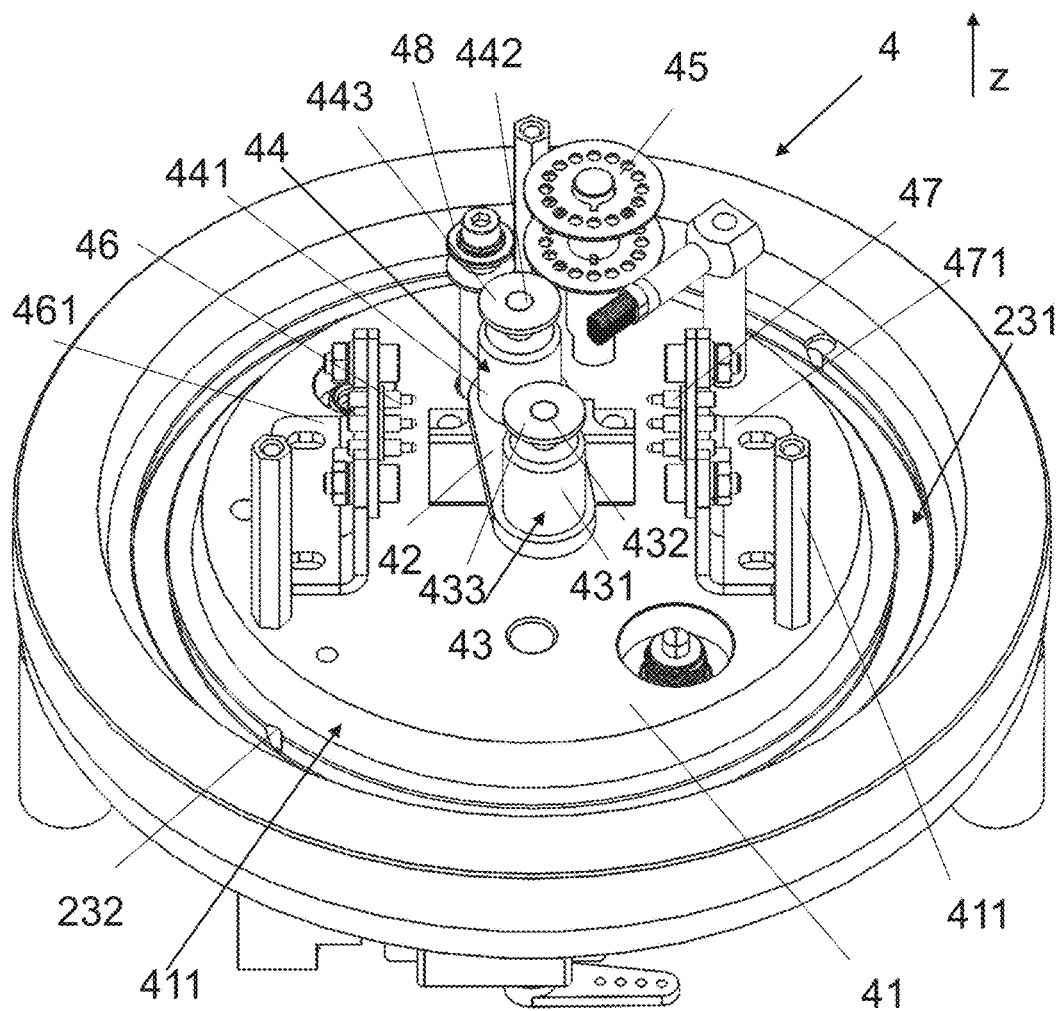
FIG. 3 a perspective view on a thread conveyor of a coating unit, according to an embodiment of the present invention.

FIG. 3 illustrates a perspective view on a thread conveyor 4 of the coating unit 2 arranged at the coating unit-vacuum chamber interface 2-3 and at least partially extending into the vacuum chamber when connected. The thread conveyor 4 is arranged on a stationary plate 41 preferably made from metal. A rotatable support 42 is arranged on the plate 41. A first and a second clamp 43 and 44 are arranged on the support 42, with each clamp 43 and 44 comprising a shell 431, 441 arranged as stationary element on/fixed to the support 42, and a movable element in form of a push rod 432, 442, arranged in the shell 431, 441 and being movable with respect to the respective shell 431, 441 in vertical direction z. The upper end of each push rod 432, 442 comprises a plate 433, 443. Presently, the clamps 43 and 44 are shown in an open position. A thread (not shown) may be clamped between the plates 432, 442 and a rim of the associate shell 431, 441 of each clamp 43, 44. In particular, such thread may be clamped in both clamps 43 and 44 and span between the clamps 43 and 44. Preferably, each push rod 432, 442 is biased against the associate shell 431, 441 by means of a biasing force, e.g. an elastic force of a spring. Preferably, in a default state, each clamp 43, 44 is closed, e.g. owed to the biasing force, each plate 433, 443 is pressed against the associate shell 431, 441.

A spool 45 is provided next to a guide roller 48, both of which are rotatable mounted. In operation, a thread wound on the spool 45 and fixed with one end thereto is guided around the guide roller 48 to the first clamp 43, where it is clamped, and on to the second clamp 44, where it is clamped, too.

Angle brackets 461 and 471 are mounted onto the plate 41. Each angle bracket 461, 471 holds one or more electrical contacts 46 and 47, preferably spring contacts. It can be derived from FIG. 3, that once the support 42 is rotated in a horizontal position, the electrical contacts 46 and 47 may contact the clamps 43 and 44. Specifically the first electrical contact 46 may be in contact with the shell 441 of the second clamp 44, and the second electrical contact 47 may be in contact with the shell 431 of the first clamp 43. In such position, and provided a thread is strained between the clamps 43 and 44, an electrical current may be applied e.g. via the angle brackets 461, 471 to the contacts 46, 47 and hence through the thread between the contacts 46, 47. The current may cause a heating of the thread, a dissolving of material from the thread by evaporation, and finally its burning. Material of the thread dissolved by this process may make its way onto a sample and generate a coating on the sample.

In addition, posts 411 may be provided on the plate 41 for supporting a coverage as will be shown later on.

The thread conveyor 4 may be considered as a part of the coating unit-vacuum chamber interface 2-3. For example, a sealing ring (not shown) may be inserted into a groove 231 of the plate 41 for pressing a rim of the vacuum chamber against when connected. Within the sealing ring, the plate 41 may also comprise a dispenser ring comprising multiple bores 232 which dispenser ring may serve as gas outlet for supplying a process gas to the vacuum chamber 3 preferably during a glowing process applied to a sample in the vacuum chamber in a preferred embodiment. Preferably, the plate 41 as such, the sealing ring and the dispenser ring are of circular shape. Preferably, the interface 2-3 seals an interior of the coating unit 2 against the vacuum chamber 3 except for the bores 232 of the dispenser ring for supplying the process gas.

Figure 4:
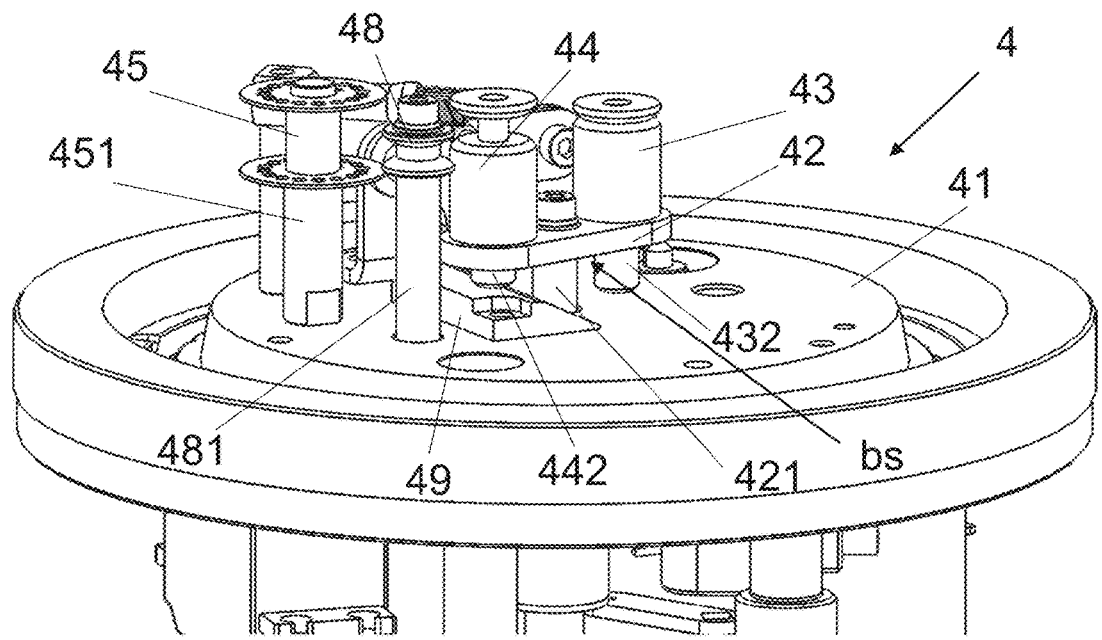
FIG. 4 a different perspective view on a thread conveyor of a coating unit, e.g. the one of FIG. 3, according to an embodiment of the present invention.

FIG. 4 shows a different perspective view on a thread conveyor 4 of a coating unit, e.g. of the coating unit 4 of FIG. 3, according to an embodiment of the present invention. In this view, the angle bracket 461 is omitted for serving a better illustration, such that a shaft 451 can be seen which serves for rotatable releasable mounting the spool 45. Another shaft 481 is provided for rotatable mounting the guide roller 48, and a different shaft 421 for rotatable mounting the support 42. On the plate 41, a deflection means 49 is arranged in vicinity to the support 42 facing a backside bs of the support.

Figure 5:
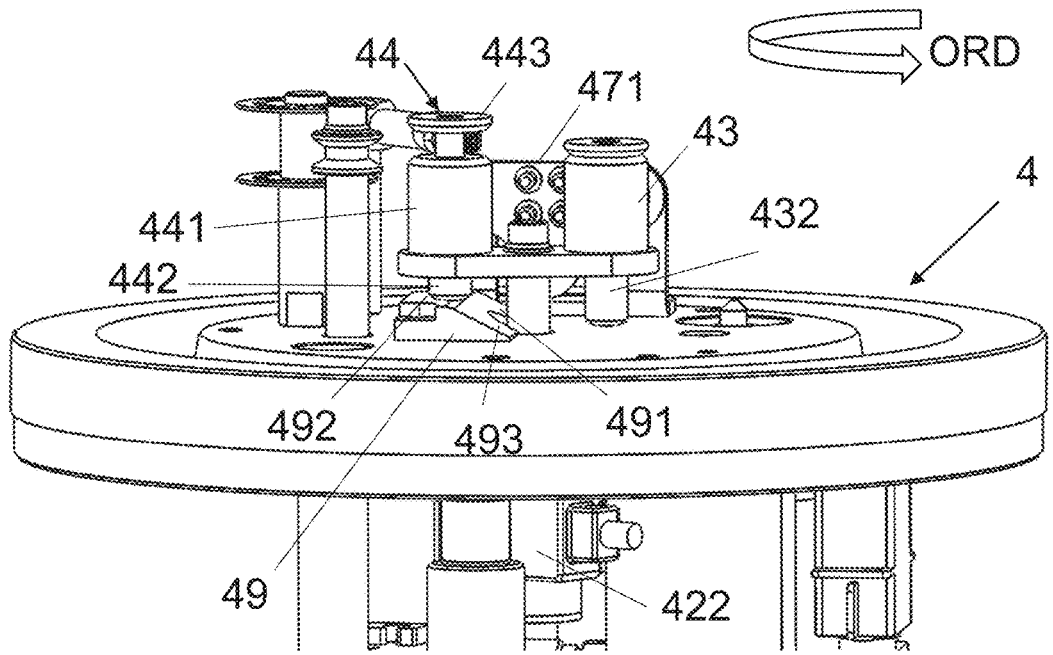
FIG. 5 a side view on a thread conveyor of a coating unit, e.g. the one of FIG. 3, according to an embodiment of the present invention.

The shape of the deflection means 49 can even better be derived from FIG. 5, which shows a side view on a thread conveyor 4 of a coating unit, e.g. of the coating unit 4 of FIG. 4, according to an embodiment of the present invention. The deflection means 49 protrude from the plate 41 and comprise a rising ramp 491, a falling ramp 493 and a platform 492 between the rising ramp 491 and the falling ramp 493. The deflection means 49 is arranged such that it impacts the push rods 432, 442 of the clamps 43, 44 dependent on the orientation of the support 42. As indicated above, the push rods 432, 442 of the clamps 43, 44 pass through holes in the support 42. Lower ends of the push rods 432, 442 hence protrude from the back side bs of the support 42. In the present position of the support 42 corresponding to the vertical position as shown in FIG. 3, the first clamp 43 is not impacted by the deflection means 49, i.e. the clamp 43 is closed, while the second clamp 44 is in an open position prepared for receiving a thread portion for clamping. In this position, the platform 492 of the deflection means 49 supports the push rod 442 against the biasing force such that the push rod 442 is deflected from the shell 441, i.e. the movable element is deflected from the stationary element.

Under the assumption that the operational rotation direction is as indicated by the arrow ORD, the push rod 442 climbed the platform 492 via the rising ramp 491 in response to the support 42 being rotated by a drive indicated by 422 in the operational rotation direction ORD. In case that in the present position of the second clamp 44 a thread portion is arranged between the plate 443 and the shell 441 of the second clamp 44, a further rotation of the support 42 in the operational rotation direction ORD may cause a closing of the second clamp 44 and hence a clamping of the thread between the plate 443 and the upper rim of the shell 441. Rotating the support 42 makes the push rod 442 going down the falling ramp 493 from the present position on the platform 492 thereby clamping the thread owed to the biasing means.

It is noted that in the position of a clamp 43, 44 not interacting with the deflection means 49, the shell 431, 441 and the push rod 432, 442 are dimensioned not to touch the plate 41 but to provide a distance between the bottom end of the push rod 432, 442 and the plate 41.

Figure 6:
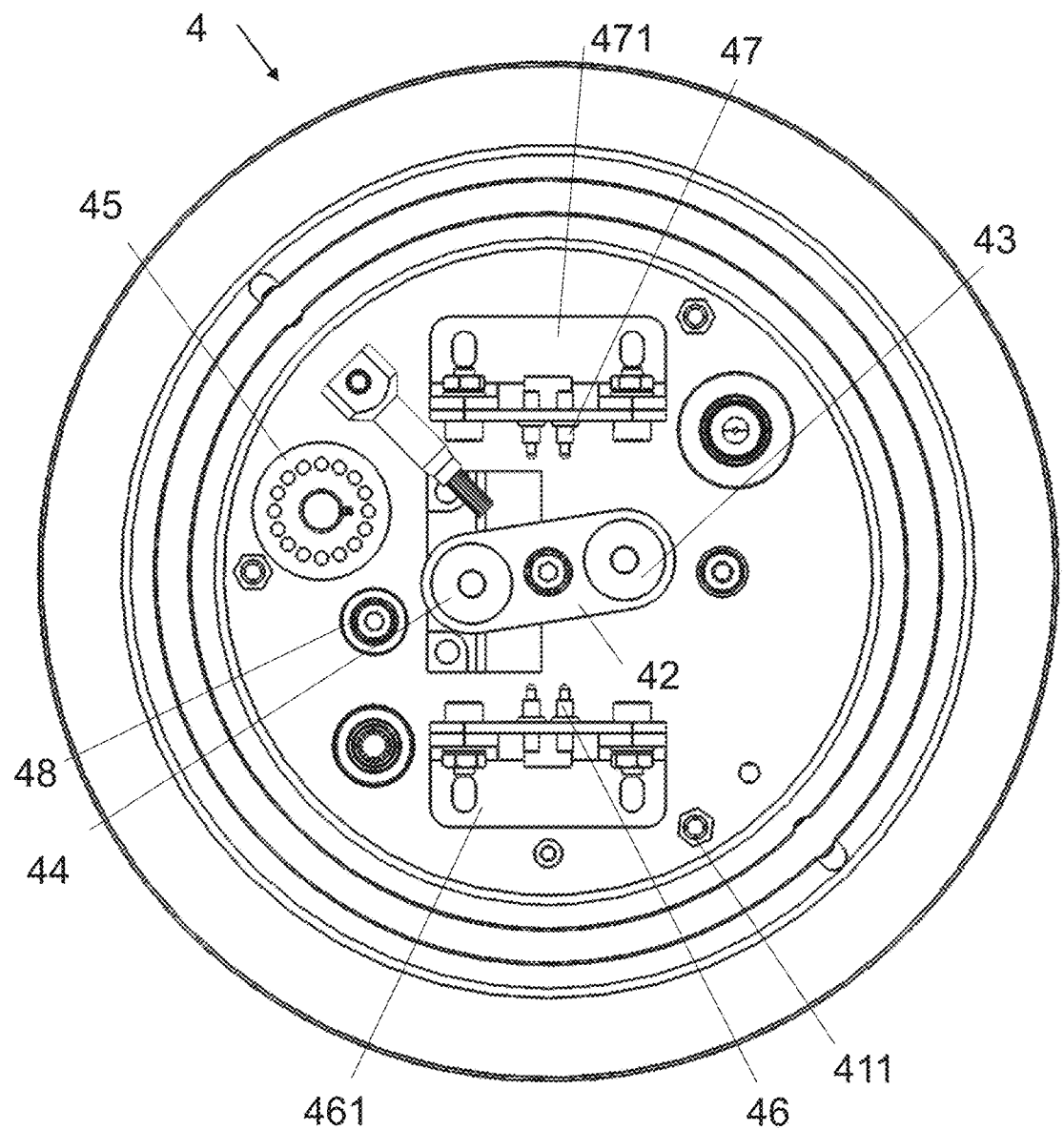
FIG. 6 a top view on a thread conveyor of a coating unit, e.g. the one of FIG. 3, according to an embodiment of the present invention.

FIG. 6 shows a top view on a thread conveyor of a coating unit, e.g. the one of FIG. 3, according to an embodiment of the present invention.

Figure 7:
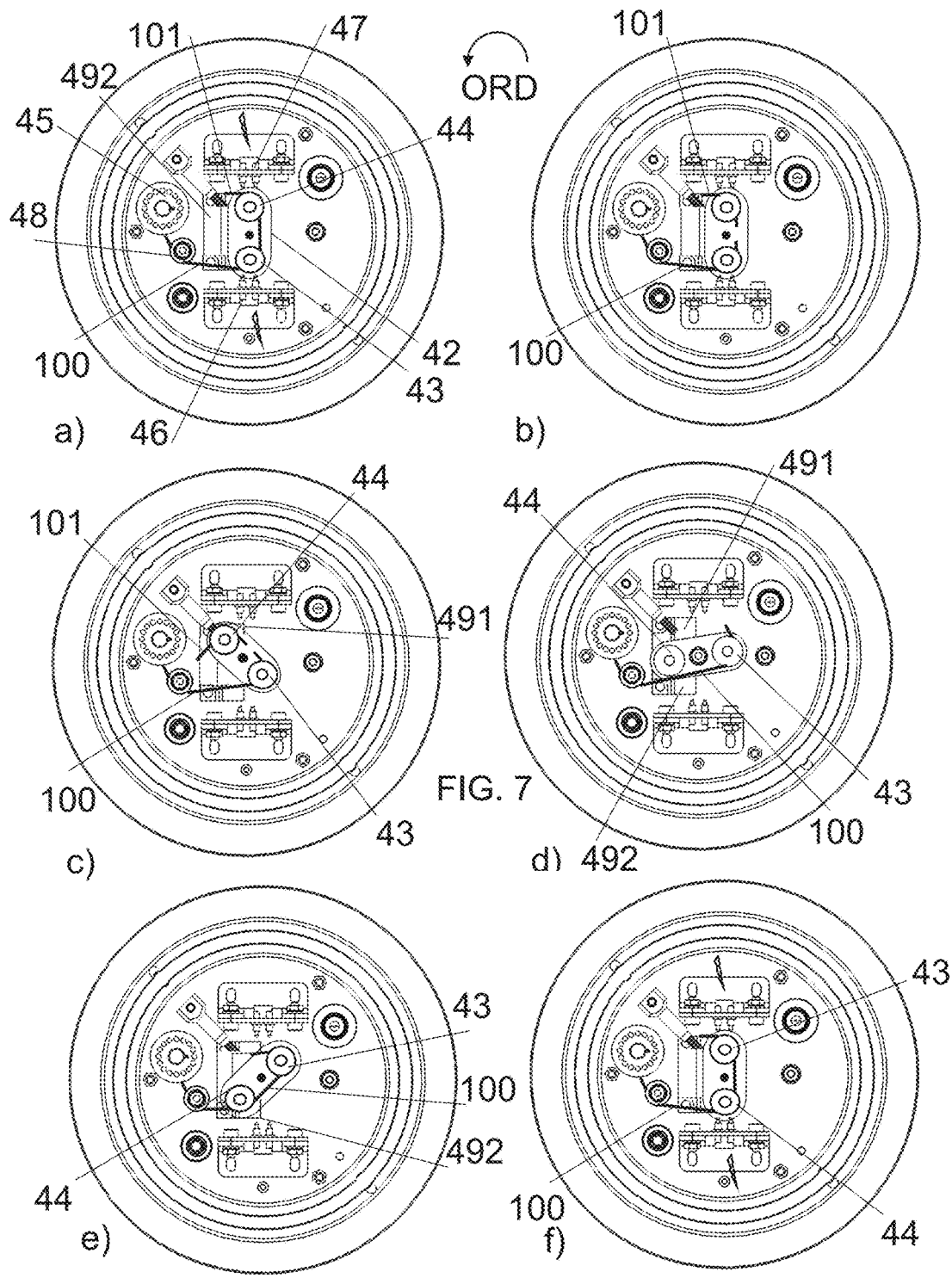
FIG. 7 different top views on a thread conveyor of a coating unit, e.g. the one of FIG. 3, at different states illustrating a method for coating a sample, according to an embodiment of the present invention.

FIG. 7 shows different top views a) to f) on a thread conveyor of a coating unit, e.g. the one of FIG. 6, in various states illustrating a method for coating a sample, according to an embodiment of the present invention. In diagram 7a), it is assumed that a thread 100 is wound on the spool 45, i.e. a first free end of the thread 100 is fixed at the spool 45. The thread 100 is diverted by guide roller 48 towards the first clamp 43 where it is clamped. The thread 100 is spanned between the first clamp 43 and the second clamp 44, where it is clamped, too. A second free end of the thread 100 is referred to by 101. The support 42 is arranged such that the first clamp 43 electrically contacts the first contact 46, and the second clamp 44 electrically contacts the second contact 47. The present position of the support 42 is also referred to as coating position where the support 42 rests in a stationary position during coating. As is indicated by the flashes, an electrical current is applied to the thread 100 between the clamps 43, 44. By applying the current, the thread 100 evaporates and the dissolved thread material falls onto a sample. Finally, the heating of the thread 100 by the electrical current leads to an interruption/a burning of the thread 100 between the clamps 43, 44 as is indicated in diagram 7b). Such state can be detected by different means. E.g., it can be detected that the current is no longer upheld which means that the thread 100 is broken. For example, in response to detecting this state, the support 42 may be rotated in the operational rotation direction ORD as is indicated in diagram 7c). In response to this rotation, the push rod 442 of the second clamp 44 travels up the rising ramp 491 of the deflection means 49. Still, it is assumed that in diagram 7c) the push rod 442 is not yet pushed sufficient for releasing the residual 101 of the thread still held by the second clamp 44. As can be derived from diagram 7c), the rotation of the first clamp 43 generates an unwinding of the thread 100 from the spool 45 which thread 100 continues to be guided around guide roller 48.

When the support 42 is continued to be rotated, a state as shown in diagram 7d) is reached. The second clamp 44 now is positioned above the platform 492 of the deflection means 49 which platform 492 makes the push rod 442 being pushed to the top at maximum, such that the plate 443 of the push rod 442 no longer rests on the corresponding shell 441. This means, that the residual thread 101 is released from the second clamp 44 and has already fallen off. However, the thread 100 still is clamped in the first clamp 43 and is continued to be unwound from the spool 45. In response to the curved path of the first clamp 43, the unwound thread 100 is positioned next to the open second clamp 44. By continuing rotating the support 42 in the operational rotation direction ORD, the thread 100 becomes positioned between the shell 441 and the plate 443 of the open second clamp 44 as is shown in diagram 7e). At this point in time, the push rod 442 of the second clamp 44 starts travelling down the falling ramp 493 of the deflection means 49 which evokes a closing of the second clamp 44 and a clamping of the thread 100 in the second clamp 44. As the rotation continues, the thread 100 becomes fully clamped in the second clamp 44 and, of course the first clamp 43, and is spanned there between. When the coating position is reached again according to diagram 7f), the clamps 43 and 44 are contacted by the electrical contacts 46 and 47 again, and an electrical current may be applied for heating the thread 100 and coating the sample. In any of the other positions shown in diagrams 7c) to 7e), the clamps 43, 44 are out of contact with the contacts 46, 47. Hence, the position shown in diagram 7f) corresponds to the coating position shown in diagram 7a), except that in diagram 7f) the first clamp 43 now is in contact with the second contact 46, and the second clamp 44 is in contact with the first contact 46.

The above process can be continued by rotating the support 42 in the operational rotation direction ORD each time the thread 100 is detected to be broken between the clamps 43, 44.

Hence, a fully automated process for coating a sample is introduced, in which no manual handling of the thread 100 is required, and in which a coating can be fabricated that exceeds the amount of material resident in a thread portion between the clamps 43, 44.

Figure 8:
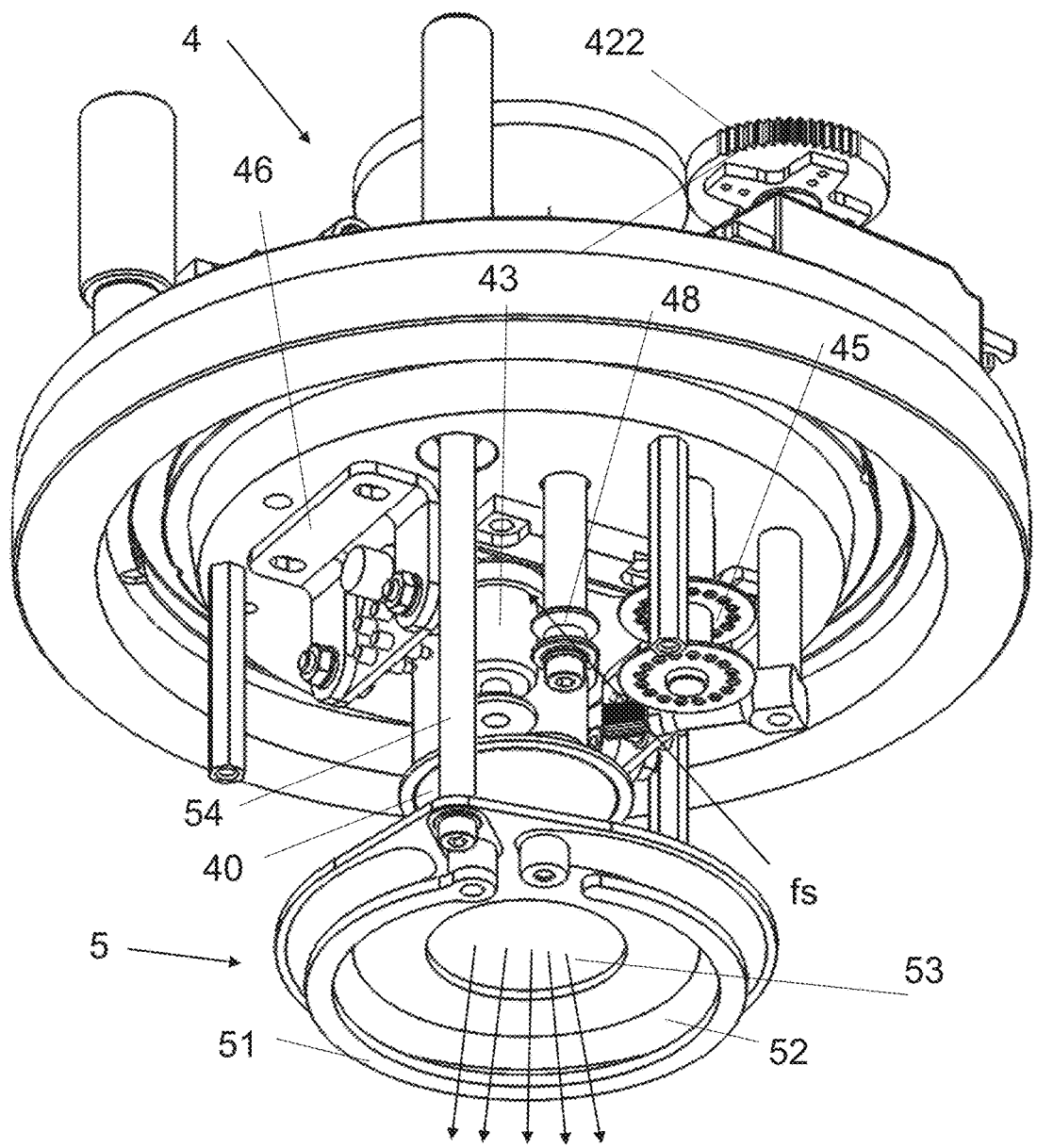
FIGS. 8-10 perspective views on thread conveyor of a coating unit, according to embodiments of the present invention.
Figure 9:
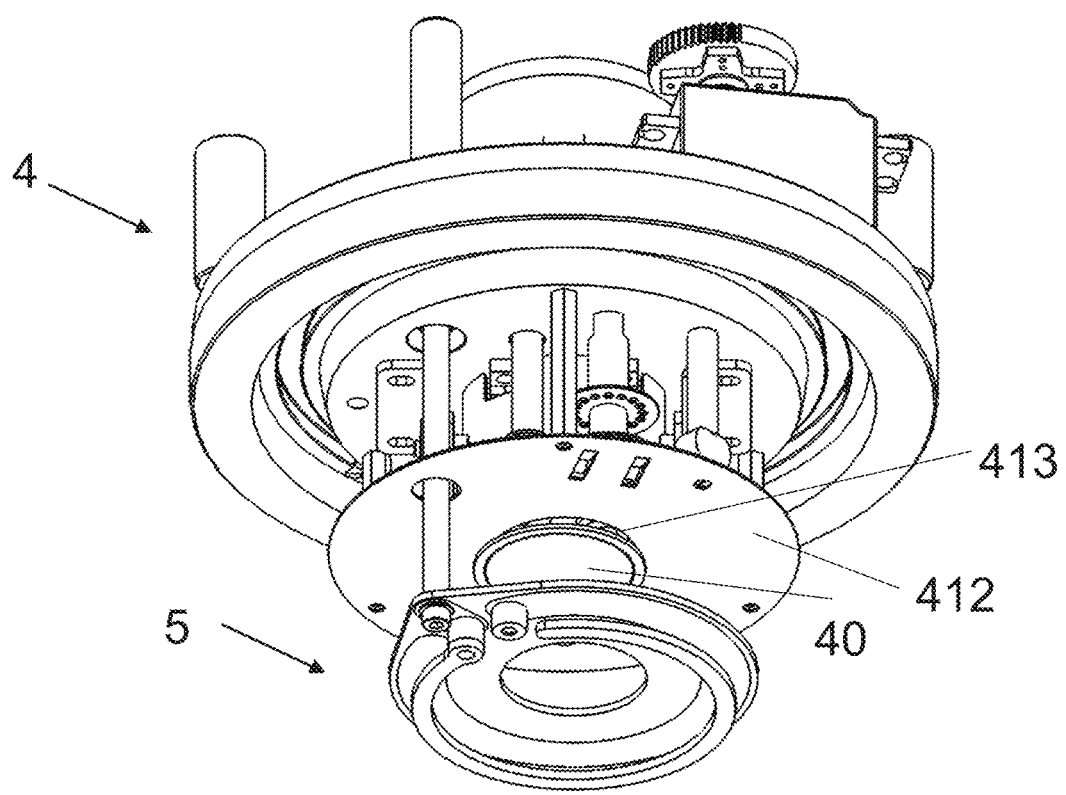
Figure 10:
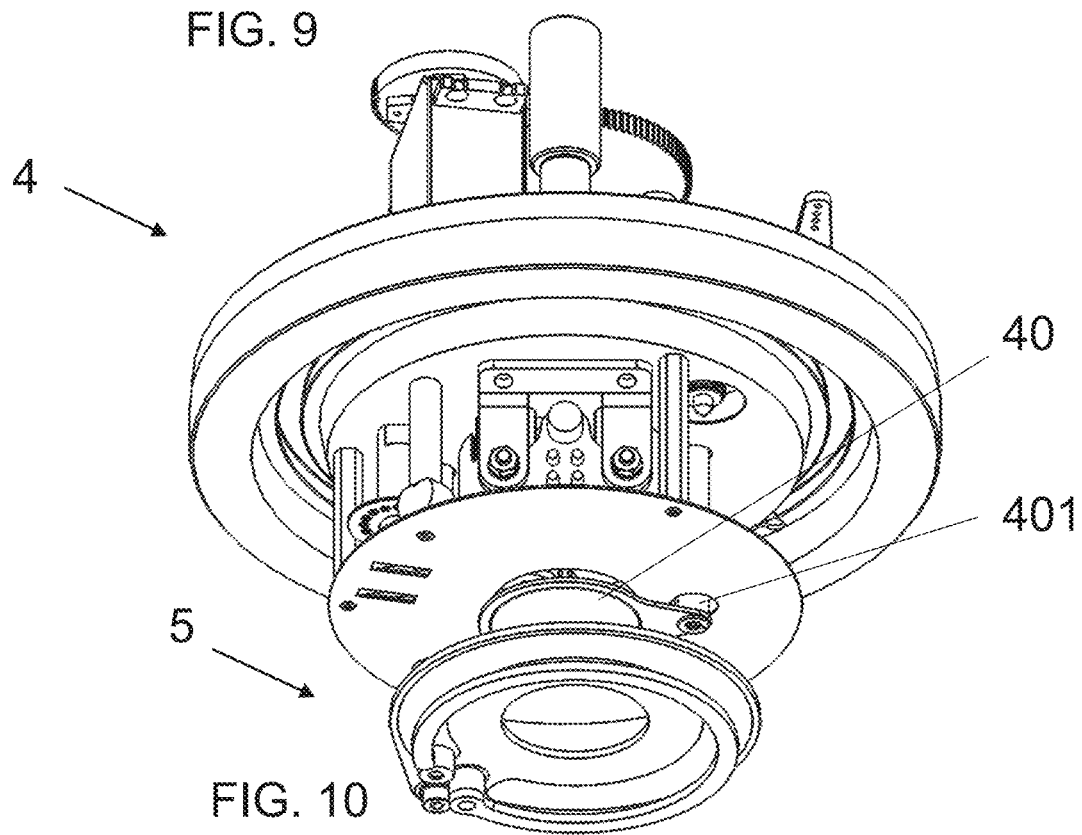

FIGS. 8-10 show perspective views of thread conveyors of coating units, according to embodiments of the present invention. In each of these embodiments, the thread conveyor 4 is extended by a glowing module 5 for glowing a coating manufactured by thread coating as discussed above. In FIG. 8, the thread conveyor 4 is depicted in is preferred position during operation. Hence, the thread conveyor 4 reaches into a vacuum chamber not shown. At the bottom of the vacuum chamber, a sample is arranged on a sample support such that material dissolved from the thread clamped between the clamps 43 and 44 falls onto the sample.

A receptacle 40 is preferably provided facing a front side fs of the support 42. The receptacle 40 preferably collects residuals of the thread 100 that fall off when straining a new piece of thread 100 between the clamps 43, 44 for continued coating. Hence, the receptacle 40 preferably is mounted movable, and preferably is mounted rotatable to a support, for deflecting the receptacle 40 into a first, collecting position as shown in FIG. 8. E.g. the receptacle 40 may automatically be deflected into the collecting position once it is detected that that the thread 100 is broken according to diagram 7b), and remains in this collecting position up to and including diagram 7e). Only when the support 42 has taken its coating position according to diagrams 7a) and 7f), the receptacle 40 may be moved from the first colleting position into a second position enabling a free deposition of material downwards to the sample through the opening 53 as indicated by arrows in FIG. 8. Hence, the receptacle 40 in particular collects residuals 101 of the thread according to diagram 7c) or d) which is released upon the automated controlled opening of one of the clamps 43, 44. The receptacle 40 prevents such thread residuals 1 falling onto the coated sample and damaging the coating or the sample.

The glowing module 5 comprises a cathode ring 51 which can be supplied with high voltage. The cathode ring 51 is protected by a protection ring 52 with the opening 53. The protection ring 52 prevents from dissolved thread material falling onto the cathode ring 51 and impairing its operation. Preferably, the protection ring 52 and the cathode ring 51 are mounted stationary or adjustable in height via posts 54, and preferably are removable.

FIGS. 9 and 10 show different perspective views on a thread conveyor 4 of a coating unit including a glowing module 5, e.g. the thread conveyor of FIG. 8, according to an embodiment of the present invention. In contrast to FIG. 8, the thread conveyors 4 of FIGS. 9 and 10 comprise an additional coverage 412 each mounted above the plate 41 by means of the posts 411. The protection plate 412 comprises an opening 413 through which the dissolved thread material may fall onto the sample. The opening 413 of the coverage 412 presently is covered by the receptacle 40 which is oriented in its collecting position. As can be seen from FIG. 10, the receptacle 40 is rotatable mounted to the support 401.

Figure 11:
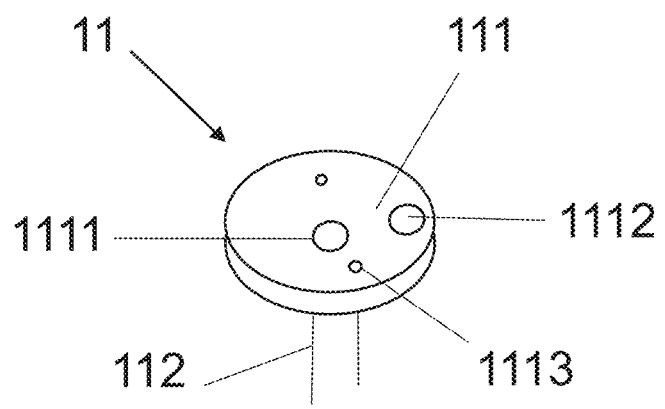
FIG. 11 a perspective view on a sample support of a base unit, according to an embodiment of the present invention.

FIG. 11 illustrates a sample support 11 in a perspective view comprising a plate 111 and a pole 112. The plate 111 comprises a first opening 1111 and a second opening 1112 for receiving a quartz as oscillating crystal each, and multiple small openings 1113 for receiving e.g. SEM (Scanning Electron Microscopy) stubs for mounting samples onto the plate 111. The plate 111 preferably is adjustable in height. The first opening 1111 is arranged in the centre of the plate 111 while the second opening 1112 is arranged close to an edge of the plate 111. It is preferred that the operator selects to cover the first opening 1111 by a sample to be coated if the sample is rather big such that a thickness of the coating coated onto the plate 111 can be measured by means of the crystal to be arranged in the second opening 1112. Instead, in case of multiple small samples to be coated at the same time, the operator may arrange these samples around the uncovered first opening 1111, and take the measurement of the coating thickness by means of the crystal to be arranged in the first opening 1111. The user interface 13 in the base unit 1 may allow to switch manually between either the first quartz or the second quartz for measuring purposes.

Figure 12:
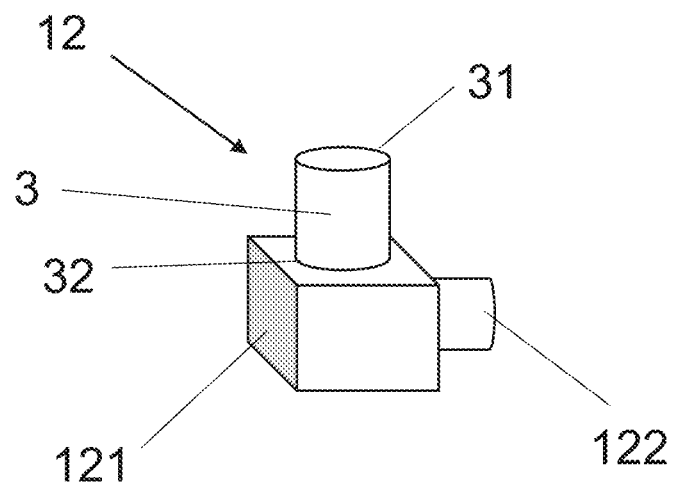
FIG. 12 a schematic vacuum building block as used in a base unit, in a perspective view, according to an embodiment of the present invention.

FIG. 12 illustrates a vacuum building block 12 comprising a stand 121 for receiving a vacuum chamber 3, and a vacuum pump 122. The vacuum chamber 3 in form of a cylinder wall has an upper end 31 and a lower end 32 and rests in the diagram in a reception of the stand 121. The vacuum pump 122 is connected via the stand 121 to the interior of the vacuum chamber 3 for generating a vacuum therein during operation. The vacuum chamber 3 is removable from the stand 121 and so from the base unit 1. Preferably a sealing is provided for sealing the vacuum chamber 3 during operation against an interior of the base unit 1. In the present FIG. 12, the sample support 11 of FIG. 11 is not shown. However, the sample support 11 typically is supported by the stand 121.

Preferably, the mechanical interfaces 2-3 and 1-3 and specifically a diameter and a circumference thereof is of a standardized format. Hence, different vacuum chambers may be attached to the base unit, e.g. distribution vacuum chambers or others, such that the base unit may be utilized also on its own as a vacuum generating unit.

Figure 13:
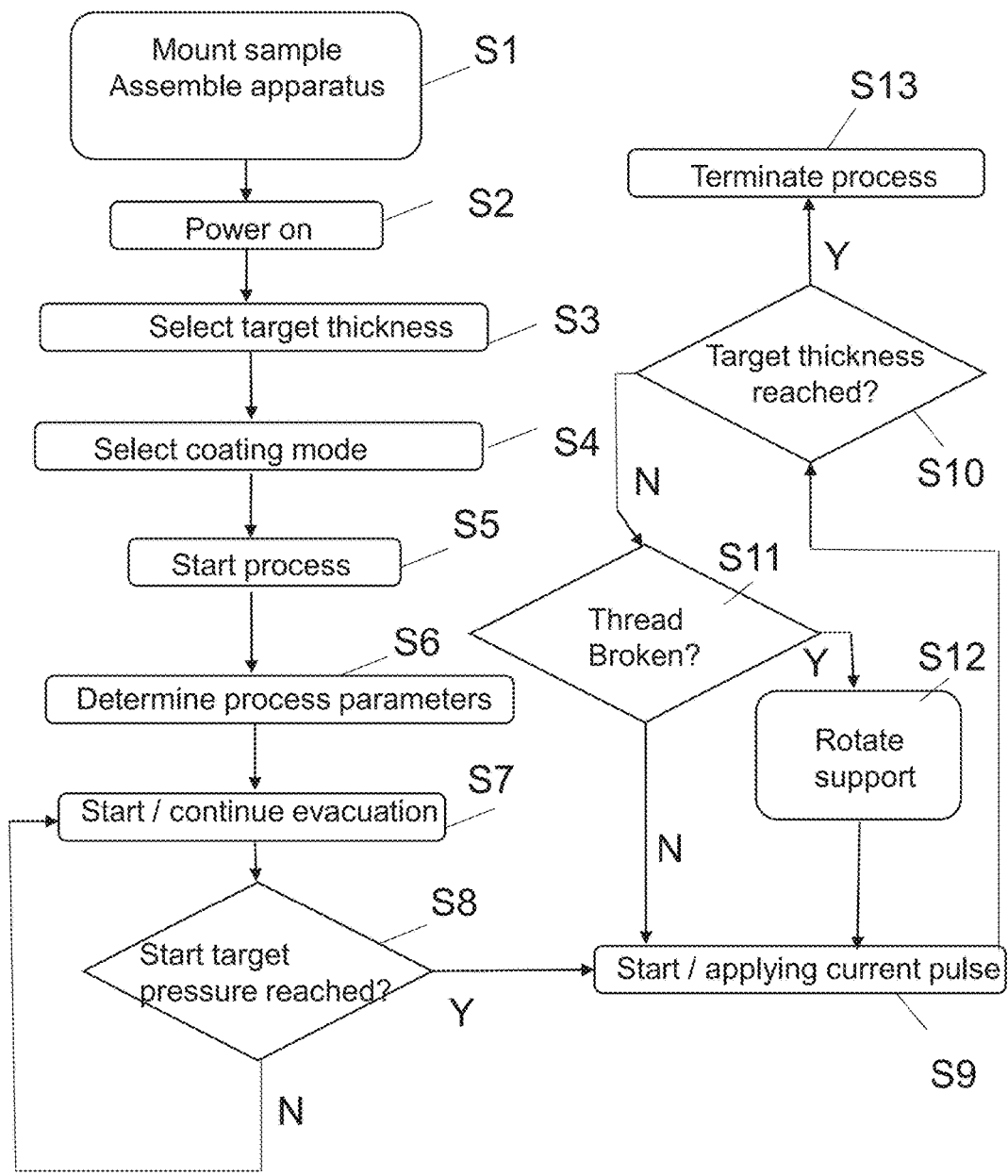
FIG. 13 a flow chart of a method according to an embodiment of the present invention.

FIG. 13 illustrates a flowchart of a method for coating a sample according to an embodiment of the present invention, preferably as conducted with an apparatus e.g. as shown in FIG. 1. In a first step S1, typically conducted manually by an operator of the apparatus, one or more samples are mounted on the sample support of the base unit, a spool comprising a thread winded thereon is arranged in the thread conveyor if not already there from a previous processing, and the free end of the thread is clamped between the first and the second clamp. Then, the coating unit, the base unit and the vacuum chamber are assembled together. In a next step S2, power of the apparatus is turned on by the operator. Step S1 and S2 can be interchanged, of course. In steps S3 and S4, the user selects via a user interface a target thickness of the coating to be generated on the sample via evaporating the thread, and a coating mode. E.g., it can be chosen between two coating modes, in a first one of which a longer break is provided between two current pulses for evaporating the carbon thread than in a second one. The first mode exposes the sample to less heat than the second mode. However, the first mode takes a longer processing time than the second mode. Then, the process is started in step S5, either automatically as soon as the control unit determines to have all the input information required for a subsequent fully automated coating process, or manually, e.g. by pressing a start button on the user interface.

The control unit may in the following determine relevant processing parameters, see step S6, preferably dependent on the selected coating mode and the selected coating thickness. The processing parameters may also be calculated by the control unit during or at the end of the operator selecting the parameters in steps S3 and S4. In response to starting the process in step S5 or in response to the control unit having determined the processing parameters in step S6, the vacuum chamber is evacuated in step S7 by means of the vacuum pump. In step S8, a pressure in the vacuum chamber is sensed. If the sensed pressure has not reached yet a target start pressure (N), no vacuum conditions are present yet suitable for coating such that the evacuation continues in step S7.

However, if the target start pressure is reached (Y), the coating process is started automatically in step S9 by applying a current pulse through the thread clamped between the two clamps.

In step S10, a thickness of the coating already deposited is sensed and compared to the target thickness. If the target thickness is already reached (Y), the coating process is terminated in step S13. If, however, the target thickness is not reached yet (N), it is determined in step S11 if the thread were broken and as a result a new portion of thread is to be clamped between the two clamps. If this is not the case (N), another electric current pulse may be applied to the thread generating thread material being dissolved and deposited on the sample. If, however, the thread is detected to be broken (Y), the support of the thread conveyor is rotated in step S12 in order to unwind a new portion of thread from the spool and clamp the new portion. Rotating the support includes rotating the support into the coating position again such that the clamps are in contact with the contacts for applying electrical current to according to step S9. Steps S10 and S11 may be interchanged such that any time after the thread is exchanged, the coating thickness is verified.

Prior to rotating the support in step S12, a receptacle may be rotated to its collecting position for collecting thread residuals, and may be rotated out of the collecting position prior to applying the next current pulse in step S9. Automatically terminating the coating process in step S13 may include deactivating the coating unit, deactivating the vacuum pump, etc. Finally, the user may dismount the coating unit from the base unit and the vacuum chamber and remove the coated sample from the sample support.

Figure 14:
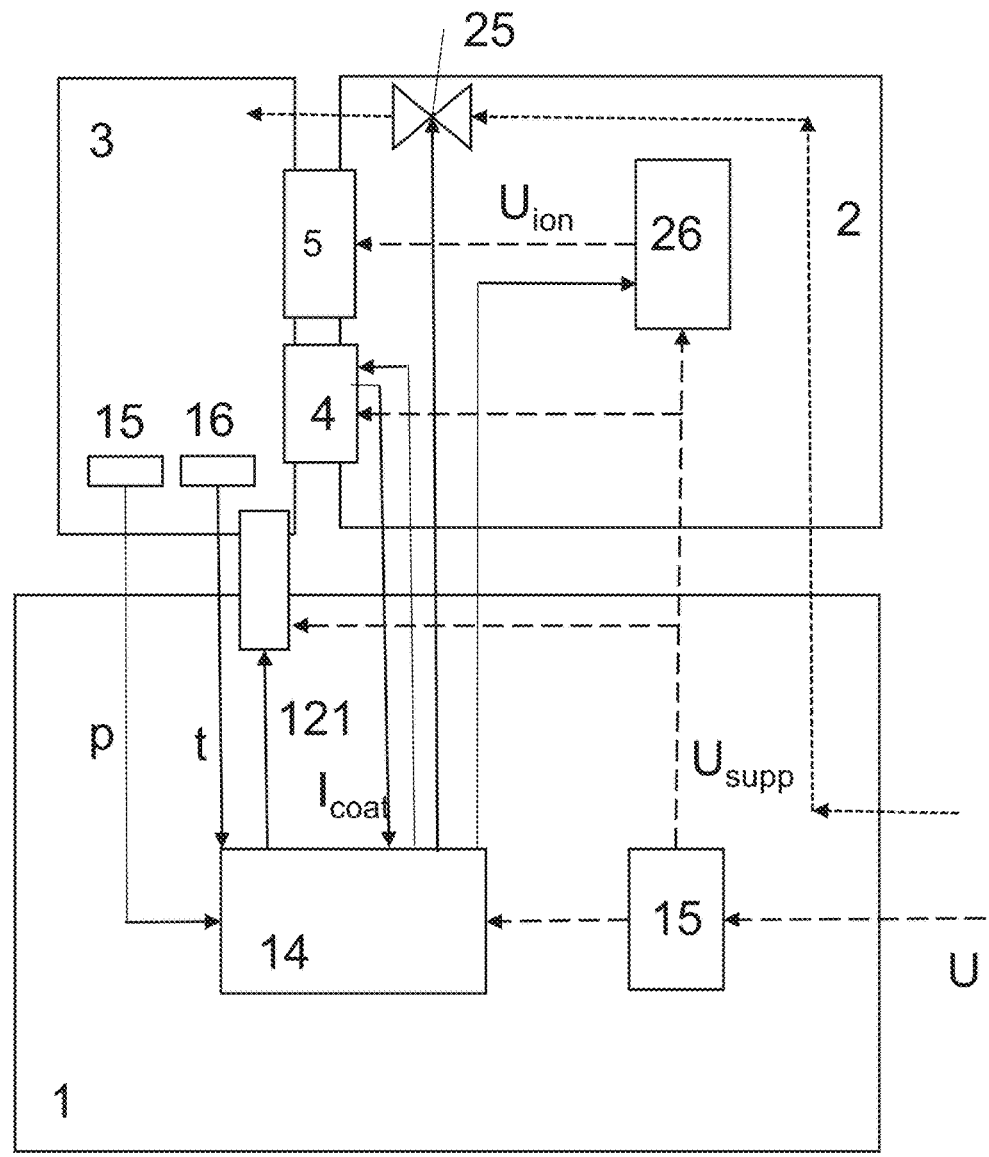
FIG. 14 a block diagram of an apparatus according to an embodiment of the present invention.

FIG. 14 illustrates a block diagram of an apparatus according to an embodiment of the present invention. Power distribution is indicated by dashed lines: External voltage U is supplied to the base unit 1, and specifically to a transformer 15 transforming the external voltage U into a supply voltage Usupp, which on the one hand supplies components of the base unit 1 with power, such as a vacuum pump 121 or a control unit 14, and on the other hand is supplied via the interface 2-3 to the coating unit 2 for operating the thread conveyor 4, for example. In case of a glowing module 5 being provided, the supply voltage Usupp may be transformed in a transformer 26 into an ionisation voltage Uion with is supplied to the glowing module 5.

Control and sensor signals are indicated by straight lines. For example, a pressure sensor 15 and a coating thickness sensor 16 provide signals representing the pressure p in the vacuum chamber and a deposited thickness t to the control unit 14. So does the coating unit 2 with a measured current pulse Icoat applied to the thread. On the other hand, the control unit 14 controls the vacuum chamber 121, the thread conveyor 4, the transformer 26 in the coating unit 2, and a valve 25 by corresponding control signals.

In case of the presence of the glowing module 5, a process gas may be required in the vacuum chamber 3 for glowing. The flow of such process gas is illustrated by dotted arrows. The process gas is supplied from external to the base unit 1, is directed via the interface 2-1 to the coating unit 2, passes an electrically controllable valve 25, and may enter the vacuum chamber 3.

The invention claimed is:

1. A coating unit for coating a sample with a material provided in a form of a thread, comprising a thread conveyor, the thread conveyor comprising:
   a first clamp and a second clamp for holding the thread therebetween,
   a rotatable support for the first and the second clamp,
   deflection means for individually transforming the first and the second clamp from a closed position into an open position and back to the closed position in response to rotation of the support,
   a drive for rotating the support evoking an unwinding of the thread from a spool, wherein the thread is clamped by the first clamp and a rotation of the support makes the thread become unwound from the spool and evokes an automated clamping of an unwound portion of the thread in the second clamp;
   wherein each of the first and the second clamp comprises a corresponding element stationary with respect to the support and an element movable with respect to the stationary element for clamping the thread between,
   wherein each movable element is deflectable from the corresponding stationary element against a biasing force;
   wherein each movable element comprises a push rod on which the deflection means acts, and wherein each push rod reaches through a corresponding hole in the support.

2. The coating unit of claim 1,
   wherein the support has a front side and a back side,
   wherein the first and the second clamp are arranged on the front side of the support, and
   wherein the deflection means is arranged facing the back side of the support.

3. The coating unit of claim 1,
   wherein each stationary element comprises a corresponding shell for the push rod, the shell protruding from the front side of the support, and
   wherein each push rod comprises a plate resting on the corresponding shell in the closed position of the clamp and being disconnected from the shell in the open position of the clamp.

4. The coating unit of claim 2,
   wherein the deflection means comprises:
   a rising ramp for lifting the movable element, in response to the rotation of the support in an operational rotation direction, and
   a falling ramp for lowering the movable element, in response to the rotation of the support in the operational rotation direction.

5. The coating unit of claim 4,
   wherein the rising ramp is followed by the falling ramp in the operational rotation direction.

6. The coating unit of claim 1, further comprising:
a first electrical contact and a second electrical contact arranged stationary for contacting one of the clamps each in response to the support being rotated in a coating position, and
a current supply for supplying an electrical current via the contacts through the thread for dissolving the material of the thread for coating the sample,
wherein the first and the second clamp are arranged symmetrically with respect to a rotation axis of the support.

7. The coating unit of claim 6,
wherein the first and the second electrical contact are spring contacts.

8. The coating unit of claim 1, further comprising a receptacle arranged at a front side of the support, wherein the receptacle is electrically controllable into a first position for collecting a residue of the thread and into a second position enabling a deposition of dissolved thread material onto the sample.

9. The coating unit of claim 1, further comprising:
a plate for supporting the thread conveyor, and
a cathode for glowing a coating on a sample,
wherein the thread conveyor is arranged between the plate and the cathode.

10. The coating unit of claim 9,
wherein the cathode is a ring shaped cathode, and
wherein a protection ring is arranged between the cathode and the thread conveyor.

11. The coating unit of claim 1, further comprising:
an interface for removably connecting the coating unit to a vacuum chamber,
an interface for removably connecting the coating unit to a base unit comprising a vacuum pump for generating a vacuum in the vacuum chamber,
wherein the coating unit—vacuum chamber interface comprises the thread conveyor.

12. The coating unit of claim 11,
wherein the coating unit comprises a housing, wherein at least parts of the thread conveyor emerge from the housing for extending into the vacuum chamber upon connecting to the vacuum chamber.

13. An apparatus for coating a sample, comprising
a coating unit according to claim 1,
a base unit comprising:
a housing,
an interface for removably connecting the base unit to a vacuum chamber,
a vacuum pump arranged in the housing for generating a vacuum in the vacuum chamber,
a sample support for disposing a sample to be coated, and
an interface for removably connecting the base unit to the coating unit for coating the sample with the material provided in the form of the thread,
wherein the vacuum chamber comprises an open upper end and an open lower end,
wherein the open upper end of the vacuum chamber is connected to the coating unit via the coating unit—vacuum chamber interface,
wherein the open lower end of the vacuum chamber is connected to the base unit via the base unit—vacuum chamber interface, and
wherein the coating unit is connected to the base unit via a coating unit—base unit interface.

14. The apparatus according to claim 13, wherein the base unit further comprises:
a sensing arrangement for determining a thickness of a coating deposited on one or more of the sample support and the sample.

15. The apparatus according to claim 14,
wherein the sensing arrangement comprises an oscillating crystal arranged in the sample support for enabling the determination of the thickness of the coating deposited on the oscillating crystal, and
wherein the sensing arrangement comprises two oscillating crystals arranged at two different locations of the sample support for enabling the determination of the thickness of the coating deposited onto the respective oscillating crystal.

16. The apparatus according to claim 14, wherein the base unit further comprises:
a control unit adapted to generate a control signal for controlling a current supply through the thread and for controlling a conveyance of the thread dependent on the determined thickness of the coating.

\* \* \* \* \*

UNITED STATES PATENT AND TRADEMARK OFFICE
CERTIFICATE OF CORRECTION

PATENT NO. : 10,480,059 B2
APPLICATION NO. : 15/147933
DATED : November 19, 2019
INVENTOR(S) : Walter Colleoni et al.

Page 1 of 1

It is certified that error appears in the above-identified patent and that said Letters Patent is hereby corrected as shown below:

On the Title Page

Item (73), should read -- Assignee: safematic GmbH, Zizers (CH)

Signed and Sealed this
Ninth Day of June, 2020

Andrei Iancu
*Director of the United States Patent and Trademark Office*